United States Patent
Sawada

(10) Patent No.: US 7,923,198 B2
(45) Date of Patent: Apr. 12, 2011

(54) METHOD OF MANUFACTURING FINE T-SHAPED ELECTRODE

(75) Inventor: Ken Sawada, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 1219 days.

(21) Appl. No.: 11/055,097

(22) Filed: Feb. 11, 2005

(65) Prior Publication Data

US 2005/0147923 A1 Jul. 7, 2005

Related U.S. Application Data

(63) Continuation of application No. PCT/JP03/09866, filed on Aug. 4, 2003.

(30) Foreign Application Priority Data

Aug. 14, 2002 (JP) .................................. 2002-236543

(51) Int. Cl.
*H01L 21/02* (2006.01)
*G03F 7/40* (2006.01)

(52) U.S. Cl. ......... 430/311; 430/313; 430/314; 430/330

(58) Field of Classification Search .................. None
See application file for complete search history.

(56) References Cited

U.S. PATENT DOCUMENTS

| 5,858,620 A | 1/1999 | Ishibashi et al. |
| 6,620,716 B2 * | 9/2003 | Makiyama et al. ........... 438/585 |
| 2003/0102285 A1 * | 6/2003 | Nozaki et al. ................... 216/41 |

FOREIGN PATENT DOCUMENTS

| JP | 5-198596 | 8/1993 |
| JP | 7-153666 | 6/1995 |
| JP | 10-107044 | 4/1998 |
| JP | 11-307549 | 11/1999 |
| JP | 2001-189283 | 7/2001 |

* cited by examiner

*Primary Examiner* — Daborah Chacko Davis
(74) *Attorney, Agent, or Firm* — Kratz, Quintos & Hanson, LLP

(57) ABSTRACT

A method of manufacturing a fine T-shaped electrode includes a step of forming a laminated resist which includes at least a photoresist layer as an uppermost layer; a step of forming an uppermost layer opening by irradiating the laminated resist with light to pattern only the photo resist layer and form an uppermost layer opening; a step of reducing the diameter of the uppermost layer opening by coating a resist pattern thickening material on the photoresist layer; a step of forming a lowermost layer opening by transferring the uppermost layer opening formed in the photoresist layer to a lower layer of the photoresist, and penetrating the laminated resist; a step of reducing the size of the lowermost opening in the lowermost layer of the laminated resist; and a step of forming a T-shaped electrode in the opening part formed through the laminated resist.

28 Claims, 14 Drawing Sheets

PRIOR ART

METHOD OF MANUFACTURING FINE T-SHAPED ELECTRODE

CROSS-REFERENCE TO RELATED APPLICATIONS

This is a continuation of Application PCT/JP03/09866, filed on Aug. 4, 2003.

BACKGROUND OF THE INVENTION

1. Field of the Invention

The present invention relates to a method of manufacturing a fine T-shaped electrode at low cost and with high throughput without using expensive processes such as electron beam lithography and SOR light exposure.

2. Description of the Related Art

Fine T-shaped electrodes are used as gate electrodes in electric field effect transistors in advanced telecommunications using high frequencies, such as the microwave and millimeter waveband. In this case, it is required that the gate length of the base part in the fine T-shaped electrode is 0.1 μm or less. The overgate part is usually designed to be larger than the base part in the fine T-shaped electrode due to the need to make the gate resistance value as low as possible.

When manufacturing this fine T-shaped electrode, in the related art, an opening which determines the gate length dimension in a lower layer of a laminated resist, and an opening which determines the size of the overgate part in an upper layer of the laminated resist, are generally formed. In this case, in order to obtain a laminated resist in which openings of different size are formed in separate layers, a plurality of resist materials having different sensitivities are required. Further, to use the lift-off method to manufacture the fine T-shaped electrode, an intermediate layer resist which ensures easy lift-off must be provided in the laminated resist. Since there are a large number of electron beam resists having different sensitivities and the gate length of the base part in the fine T-shaped electrode is required to be 0.1 μm or less, the fine T-shaped electrode was usually manufactured using electron beam resists in the laminated resist by high cost electron beam lithography. However, the fine T-shaped electrode could not be manufactured at low cost with high throughput.

In order to solve the problems, a process has been proposed which makes partial use of light exposure with a multilayer resist comprising not only an electron beam resist, but also a photoresist with superior throughput to electron beam lithography, to manufacture the fine T-shaped electrode. For example, in Japanese Patent Application Laid-Open No. 07-153666, the following process is described. As shown in FIG. 23A, an opening 12 is formed in a lower layer resist 11 coated on a substrate 20 by electron beam lithography, an upper resist 14 is coated thereon, and a mixing layer 15 of the upper resist 14 and lower layer resist 11 is thereby formed. By irradiating the upper resist 14 with ultraviolet light 16 to form a cross-sectional T-shaped pattern as shown in FIG. 23B, forming a T-shaped gate electrode as shown in FIG. 23C, and removing the lower layer resist 11 and other resists as shown in FIG. 23D, a fine T-shaped gate electrode is manufactured. Herein, an overgate portion where an overgate part of the T-shaped gate electrode 18 is to be formed, is formed by light exposure, and the gate length of the base part in the T-shaped gate electrode 18 is shortened by forming an opening by electron beam lithography using an electron beam resist as the lower layer resist 11.

However, in order to obtain a gate length of 0.1 μm or less, the opening 12 provided in the lower layer resist 11 had to be formed by electron beam lithography, and there was, therefore, a problem of high cost and low throughput.

On the other hand, JP-A No. 11-307549 describes forming a fine T-shaped electrode by patterning with high throughput and as finely as by EB exposure using an i line stepper. As shown in FIG. 24A, a resist film 23 for EB exposure, a buffer film 24 and a resist film 25 for i line exposure are successively formed on a substrate 20. Subsequently, the resist film 25 for i line exposure and the buffer film 24 is subjected to a patterning by i line exposure to thereby form a first opening 25a. Next, as shown in FIG. 24B, dry etching is performed on the resist film 23 for EB exposure using the resist film 25 for i line exposure as a mask, and the pattern of the i line exposure resist film 25 was transferred to the EB exposure resist film 23 to thereby form a second opening 23a.

Next, as shown in FIG. 24C, a third resist film 26 which is a chemical amplification type and can form a mixing layer 27 with the resist film 23 for EB exposure is applied all over the resist film 23 for EB exposure. Thereby, the wall surface of the second opening 23a is covered with the mixing layer 27, and the opening width of the second opening 23a is reduced. Next, as shown in FIG. 24D, patterning is performed by i line exposure on the third resist film 26. By forming an electrode and removing the resist film, a T-shaped gate electrode is thus obtained. In this case, as electron beam lithography is not used and only light exposure by the i line stepper is used, low cost is achieved.

However, exposure by the i line stepper must be performed twice, i.e., when the opening of the resist film 25 for i line exposure is formed and when the opening of the third resist film 26 is formed, and this does not provide a sufficiently high throughput. The opening of the resist film 25 for i line exposure is around 0.4 μm and the first opening 23a has similar dimensions, but there is a problem in that when the opening is reduced by the mixing layer 27 from these dimensions to 0.1 μm or less, dimensional control is poor and difficult to perform. Also, since the T-shape is formed by two layers, i.e., the third resist film 26 and the mixing layer 27, there is a problem in that lift-off of the resist film when the fine T-shaped gate electrode of 0.1 μm or less is manufactured, is not easy.

Accordingly, an object of the present invention is to provide a method of manufacturing a fine T-shaped electrode at low cost and with high throughput without using expensive processes such as electron beam lithography or SOR light exposure.

SUMMARY OF THE INVENTION

The method of manufacturing the fine T-shaped electrode according to the present invention includes a step of forming a laminated resist which includes at least a photoresist layer as an uppermost layer; a step of forming an uppermost layer opening by irradiating the laminated resist with light to pattern only the photo resist layer and form an uppermost layer opening; a step of reducing the diameter of the uppermost layer opening formed in the photoresist layer by coating a resist pattern thickening material on the photoresist layer; a step of forming a lowermost layer opening in the lowermost layer of the laminated resist by transferring the uppermost layer opening formed in the photoresist layer to a lower layer of the photoresist, and penetrating the laminated resist; a step of reducing the size of the lowermost opening in the lowermost layer of the laminated resist; and a step of forming a T-shaped electrode in the opening formed through the laminated resist.

In the step of forming a laminated resist, a laminated resist including at least a photoresist layer as an uppermost layer, is formed on the surface where a T-shaped gate electrode is to be formed. In the step of forming an uppermost layer opening, the laminated resist is irradiated with light, only the photo resist layer is subjected to patterning and an uppermost layer opening is formed. In the step of reducing the diameter of the uppermost layer opening, the resist pattern thickening material is coated on the photoresist layer to reduce the diameter of the uppermost layer opening formed on the photoresist layer. In the step of forming a lowermost layer opening, the uppermost layer opening formed in the photoresist layer is transferred to a lower layer of the photoresist layer and the laminated resist is penetrated to form a lowermost layer opening in the lowermost layer of the laminated resist. In the step of reducing the size of the lowermost opening, the size of the lowermost layer opening in the lowermost layer of the laminated resist is reduced. In the step of forming a T-shaped electrode, a T-shaped electrode is formed in the opening part formed through the laminated resist. In this way, a fine T-shaped electrode having a gate length of about 0.1 µm or less, can be manufactured at low cost and with high throughput.

DESCRIPTION OF THE PREFERRED EMBODIMENTS

Method of Manufacturing Fine T-Shaped Electrode

Figure 1:
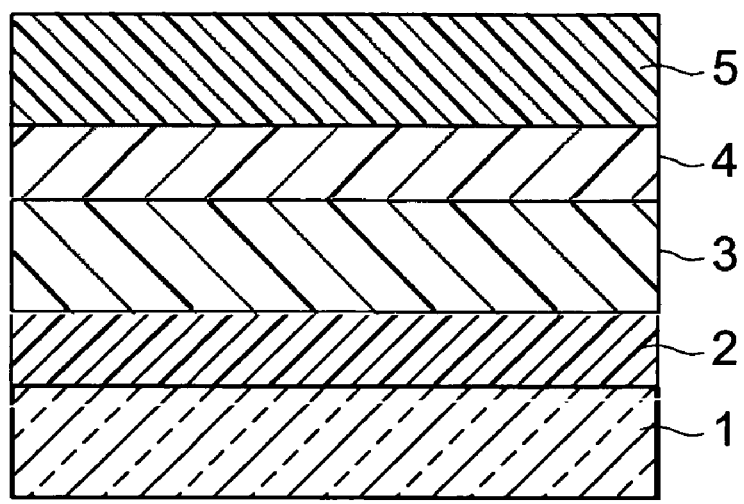
FIG. 1 is a schematic diagram describing an example of a step of forming a laminated resist in a method of manufacturing a fine T-shaped electrode according to the present invention.

The method of manufacturing the fine T-shaped electrode according to the present invention includes a step of forming a laminated resist, a step of forming an uppermost layer opening, a step of reducing the size of the uppermost opening, a step of forming a lowermost layer opening, a step of forming a T-shaped electrode, and may include other steps if required.

—Step of Forming Laminated Resist—

The step of forming a laminated resist is a step which forms a laminated resist including at least a photoresist layer sensitive to light as an uppermost layer on a Surface where a T-shaped gate electrode is to be formed.

The surface where a gate electrode is to be formed is not particularly limited, and may be suitably selected according to the purpose. Examples thereof are surfaces where a gate electrode is to be formed in various semiconductor devices and the like. Among these, a surface where a gate electrode is to be formed in field-effect transistors in advanced telecommunications using high frequencies in the microwave and millimeter waveband, is particularly suitable.

The laminated resist is not particularly limited as long as it comprises a photoresist film sensitive to light as the uppermost layer, and the number of laminated layers, resist type, the thickness of each layer and the opening diameter are suitably selected according to the purpose.

The photoresist for forming the photoresist layer (hereinafter may be referred to as "uppermost layer") is not particularly limited and may be suitably selected according to the purpose, but suitable examples are a g line resist, i line resist, KrF resist, ArF resist and F2 resist. Among these, the i line resist is preferred from the viewpoint that the fine T-shaped electrode can be manufactured economically with high throughput. The photoresists may be commercial products.

The laminated resist is not particularly limited and may be suitably selected according to the purpose, but suitable examples are: (1) a three-layer structure comprising a lowermost layer for forming an opening for the base part of the fine T-shaped electrode, an upper layer for forming an opening for the overgate part of the fine T-shaped electrode and the uppermost layer, (2) a four-layer structure (FIG. 1) comprising the lowermost layer, an intermediate layer for making lift-off easy, the upper layer and the uppermost layer, (3) a four-layer structure comprising the lowermost layer, the upper layer, an insulating layer having excellent etching resistance provided immediately thereabove and the uppermost layer, and (4) a five-layer structure (FIG. 2) comprising the lowermost layer, the intermediate layer for making lift-off easy, the upper layer, the insulating layer and the uppermost layer.

The resist material of the layers forming the laminated resist is not particularly limited as long as the uppermost layer is a photoresist, but the layer immediately below the uppermost layer, preferably a layer other than the uppermost layer, may be suitably selected from among materials which do not react to the light to which the uppermost layer is sensitive.

The material of the lowermost layer is not particularly limited and can be suitably selected according to the purpose, but it is preferably a material which is not sensitive to light, and more preferably a material which can be thickened by the resist pattern thickening material, e.g., polymethyl methacrylate (PMMA) resist. The PMMA resist includes PMMA resin itself and derivatives of the PMMA resin in which substituents are introduced.

The material of the intermediate layer is not particularly limited and may be suitably selected according to the purpose, but from the viewpoint of efficiently forming the overgate part of the fine T-shaped electrode, a material which can be side-etched is more preferred, e.g., a resist having polymethyl glutarimide (PMGI) as its main component.

The material of the upper layer is not particularly limited and may be suitably selected according to purpose, but it is preferably a material which is not sensitive to light, e.g., a polystyrene polymer-containing resist containing a polystyrene polymer and an acrylic resin.

Commercial products may be suitably used as these materials.

The material of the insulating layer is not particularly limited and may be suitably selected according to the purpose, e.g., a material which can be deposited by plasma CVD, such as Sin, SiON and the like, is preferred. When the insulating layer is provided in the laminated resist, even if the etching resistance of the photoresist layer (uppermost layer) is insufficient, the shape of the uppermost layer opening can be maintained, which is an advantage.

The thickness of the layers forming the laminated resist is not particularly limited and may be suitably selected according to the purpose, but the thicknesses used for T-shaped electrode manufacture in the related art may conveniently be employed herein.

—Step of Forming Uppermost Layer Opening—

The step of forming an uppermost layer opening is a step which forms the uppermost layer opening by irradiating the laminated resist with light so as to pattern only the uppermost layer.

The light which irradiates the laminated resist is not particularly limited and may be suitably selected according to the type of resist material forming the uppermost layer in the laminated resist, but suitable examples are g line, 5 line, KrF excimer laser, ArF excimer laser and F2 excimer laser. Among these, ultraviolet irradiation is preferred, and from the viewpoint of manufacturing the fine T-shaped electrode economically with high throughput, the i line is particularly preferred.

The exposure apparatus used in the light irradiation is not particularly limited and may be suitably selected according to the purpose, but an i line stepper may for example be mentioned. When the upper layer is patterned, a photomask may be suitably used.

In the uppermost layer, from the viewpoint of making the gate length of the fine T-shaped electrode short and performing exposure such as i line exposure, the opening diameter formed in the laminated resist is preferably about 0.35 to 0.50 μm.

In the step of forming an uppermost layer opening, by irradiating the laminated resist with light, only the photoresist layer (uppermost layer) is patterned to form the uppermost layer opening.

—Step of Reducing Uppermost Layer Opening—

The step of reducing an uppermost layer opening is a step which reduces the diameter of the uppermost layer opening formed in the photoresist layer (uppermost layer) by coating the resist pattern thickening material on the photoresist layer (uppermost layer).

—Resist Pattern Thickening Material—

The resist pattern thickening material contains a resin, a crosslinking agent and a surfactant. As needed, the resist pattern thickening material may further contain a water-soluble aromatic compound, a resin comprising an aromatic compound in a portion thereof, an organic solvent and other components.

The resist pattern thickening material is water-soluble or alkali-soluble.

The resist pattern thickening material may be used in the form of an aqueous solution, a colloidal solution or an emulsion, but an aqueous solution is preferred.

The resin is not particularly limited and may be suitably selected according to the purpose, but a water-soluble or alkali-soluble resin is preferred, and a resin which can cause a crosslinking reaction or a resin which can be mixed with a water-soluble crosslinking agent if it does not cause a crosslinking reaction, is more preferred.

When the resin is water-soluble, the water-soluble resin preferably exhibits water solubility of 0.1 g or more in 100 g of water at a water temperature of 25° C.

Examples of the water-soluble resin include polyvinyl alcohol, polyvinyl acetal, polyvinyl acetate, polyacrylic acid, polyvinyl pyrolidone, polyethyleneimine, polyethylene oxide, styrene-maleic acid copolymer, polyvinylamine, polyallylamine, an oxazoline group-containing water-soluble resin, a water-soluble melamine resin, a water-soluble urea resin, an alkyd resin, and a sulfonamide resin.

When the resin is alkali-soluble, the alkali-soluble resin preferably exhibits alkali solubility of 0.1 g or more in 100 g of a 2.38% by mass TMAH aqueous solution at a solution temperature of 25° C.

Examples of the alkali-soluble resin are novolak resin, vinylphenol resin, polyacrylic acid, polymethacrylic acid, poly p-hydroxyphenylacrylate, poly p-hydroxyphenylmethacrylate, and copolymers thereof.

The resin may be used alone, or two or more may be used in combination. Among these, polyvinyl alcohol, polyvinyl acetal and polyvinyl acetate are preferred.

The content of the resin in the resist pattern thickening material depends on the type and content of the crosslinking agent, so that it is impossible for it to be prescribed unconditionally. However, the content may be suitably selected according to the purpose.

The crosslinking agent is not particularly limited and may be suitably selected according to the purpose, but it is preferably a water-soluble material which causes crosslinking by the action of heat or acid, an example being an amino crosslinking agent.

Suitable examples of the amino crosslinking agent are a melamine derivative, a urea derivative, and an uril derivative. These may be used alone, or two or more may be used in combination.

Examples of the urea derivative include urea, alkoxymethylene urea, N-alkoxymethylene urea, ethylene urea, ethylene urea carboxylic acid, and their derivatives.

Examples of the melamine derivative are alkoxymethyl melamine, and their derivatives.

Examples of the uril derivative are benzoguanamine, glycol uril, and their derivatives.

The content of the crosslinking agent in the resist pattern thickening material depends on the type and content of the resin, so that it is impossible for it to be prescribed unconditionally. However, it can be suitably selected according to the purpose.

The surfactant is not particularly limited and may be suitably selected according to the purpose. Examples of the surfactant include a nonionic surfactant, a cationic surfactant, an anionic surfactant, and an amphoteric surfactant. These may be used alone, or two or more may be used in combination. Among these, the non-ionic surfactant is preferred from the viewpoint that it does not contain metal ions.

Suitable examples of the nonionic surfactant are the ones selected from an alkoxylate surfactant, fatty acid ester surfactant, amide surfactant, alcohol surfactant, and ethylenediamine surfactant. Specific examples of these include a polyoxyethylene-polyoxypropylene condensation compound, polyoxy alkylene alkylether compound, polyoxy ethylene alkylether compound, polyoxy ethylene derivative compound, sorbitan fatty acid ester compound, glycerine fatty acid ester compound, primary alcohol ethoxylate compound, phenol ethoxylate compound, nonyl phenol ethoxylate compound, octyl phenol ethoxylate compound, lauryl alcohol ethoxylate compound, oleyl alcohol ethoxylate compound, fatty acid ester, amide, natural alcohol, ethylenediamine and secondary alcohol ethoxylate.

The cationic surfactant is not particularly limited and may be suitably selected according to the purpose. Examples thereof include an alkyl cationic surfactant, amide quaternary cationic surfactant, and ester quaternary cationic surfactant.

The amphoteric surfactant is not particularly limited and may be appropriately selected according to the purpose. Examples thereof include an amine oxide surfactant and betaine surfactant.

The content of the surfactant in the resist pattern thickening material depends on the type and content of the resin and crosslinking agent, so that it is impossible for it to be prescribed unconditionally. However, the content may be suitably selected according to the purpose.

When the resist pattern thickening material contains a water-soluble aromatic compound, the preferable point is that the etching resistance of the uppermost layer opening can be remarkably improved.

The water-soluble aromatic compound is not particularly limited, as long as it is an aromatic compound that has water-solubility, and it can be suitably selected according to the purpose.

The compound having water-solubility such that 1 g or more is dissolved into 100 g of water at 25° C. is preferable, and the compound having water-solubility such that 3 g or more is dissolved into 100 g of water at 25° C. is more preferable. Particularly, the most preferable is the compound having water-solubility such that 5 g or more is dissolved into 100 g of water at 25° C.

Examples of the water-soluble aromatic compound are a polyphenol compound, an aromatic carboxylic acid compound, a naphthalene polyhydroxy compound, a benzophenone compound, a flavonoid compound, a porphin, a water-soluble phenoxy resin, an aromatic-containing water-soluble dye, derivatives thereof, and glycosides thereof. These may be used alone, or two or more may be used in combination.

Examples of the polyphenol compound and its derivative include catechin, anthocyanidin (pelargonidin-type (4'-hydroxy), cyanidin-type (3',4'-dihydroxy), delphinidin-type (3', 4',5'-trihydroxy)), flavan-3,4-diol, proanthocyanidin, resorcine, resorcine[4]arene, pyrogallol, gallic acid, and derivatives or glycosides thereof.

Examples of the aromatic carboxylic acid compound and its derivative include salicylic acid, phthalic acid, dihydroxy benzoic acid, tannin, and derivatives or glycosides thereof.

Examples of the naphthalene polyhydroxy compound and its derivative include naphthalene diol, naphthalene triol, and derivatives or glycosides thereof.

Examples of the benzophenone compound and its derivative include alizalin Yellow A, and derivatives or glycosides thereof.

Examples of the flavonoid compound and its derivative include flavone, isoflavone, flavanol, flavonone, flavonol, flavan-3-ol, aurone, chalcone, dihydrochalcone, quercetin, and derivatives or glycosides thereof.

Among the water-soluble aromatic compounds, from the viewpoint of excellent water-solubility, the compound having two or more polar groups is preferable, the compound having three or more is more preferable, and the compound having four or more is particularly preferable.

The polar group is not particularly limited and may be suitably selected according to the purpose. Examples thereof are a hydroxyl group, a carboxyl group, a carbonyl group and a sulfonyl group.

The content of the water-soluble aromatic compound in the resist pattern thickening material can be decided according to the type and content of the resin, the crosslinking agent and the like.

When the resist pattern thickening material contains a resin comprising an aromatic compound in a portion thereof, the preferable point is that the etching resistance of the uppermost layer opening can be remarkably improved.

The resin comprising an aromatic compound in a portion thereof is not particularly limited and may be suitably selected according to the purpose. However, those that can cause a crosslinking reaction are preferable. Suitable examples thereof include a polyvinyl aryl acetal resin, a polyvinyl aryl ether resin, a polyvinyl aryl ester resin, and derivatives thereof. It is preferable to use at least one type selected therefrom. From the viewpoint of exhibiting water-solubility or alkali-solubility to an appropriate degree, such a resin that contains an acetyl group is more preferable. These may be used alone, or two or more may be used in combination.

The polyvinyl aryl acetal resin is not particularly limited and may be suitably selected according to the purpose. Examples thereof include β-resorcinol acetal and the like.

The polyvinyl aryl ether resin is not particularly limited and may be suitably selected according to the purpose. Examples thereof include 4-hydroxybenzyl ether and the like.

The polyvinyl aryl ester resin is not particularly limited and may be suitably selected according to the purpose. Examples thereof include benzoate and the like.

The method of producing the polyvinyl aryl acetal resin is not particularly limited and may be suitably selected according to the purpose. A suitable example thereof is a known method of producing using a polyvinyl acetal reaction, or the like. The method is a method in which, for example, polyvinyl alcohol, and aldehyde in an amount needed stoichiometrically for the polyvinyl alcohol are made to undergo an acetalizing reaction in the presence of an acid catalyst. Specifically, suitable examples are the methods disclosed in U.S. Pat. Nos. 5,169,897 and 5,262,270, Japanese Patent Application Laid-Open (JP-A) No. 05-78414, and the like.

The method of producing the polyvinyl aryl ether resin is not particularly limited and may be suitably selected according to the purpose. Examples thereof are a copolymerization reaction of a corresponding vinyl aryl ether monomer and vinyl acetate; an etherizing reaction of polyvinyl alcohol and an aromatic compound having a halogenated alkyl group in the presence of a basic catalyst (the ether synthesizing reaction by Williamson); and the like. Specifically, suitable examples are the methods disclosed in JP-A Nos. 200140086, 2001-181383, 06-116194, and the like.

The method of producing the polyvinyl aryl ester resin is not particularly limited and may be suitably selected according to the purpose. Examples thereof are a copolymerization reaction of a corresponding vinyl aryl ester monomer and vinyl acetate; an esterizing reaction of polyvinyl alcohol and an aromatic carboxylic acid halide compound in the presence of a basic catalyst; and the like.

The aromatic compound in the resin having an aromatic compound at a portion thereof, is not particularly limited and may be suitably selected according to the purpose. Suitable examples thereof are a monocyclic aromatic benzene derivative, pyridine derivative, and a compound in which a plurality of aromatic rings are fused together (polycyclic aromatic compound such as naphthalene and anthracene).

Suitable examples of the aromatic compound in the resin having an aromatic compound at a portion thereof are ones having at lease one selected from the functional groups such as, for instance, hydroxyl group, cyano group, alkoxyl group, carboxyl group, amino group, amide group, alkoxycarbonyl group, hydroxyalkyl group, sulphonyl group, acid anhydride group, lactone group, cyanate group, and ketone group and the sugar derivatives from the viewpoint of having appropriate water-solubility. The one having at least one functional group selected from the hydroxyl group, amino group, sulphonyl group, carboxyl group, and their derivatives, is more preferable.

The molar content ratio of the aromatic compound in the resin having an aromatic compound at a portion thereof, is not particularly limited as long as it does not affect the etching resistance, and may be suitably selected according to the purpose. In the case where high etching resistance is needed, the molar content ratio is preferably 5 mol % or more, and more preferably, 10 mol % or more.

The molar content ratio of the aromatic compound in the resin having an aromatic compound at a portion thereof can be measured with use of, for instance, NMR or the like.

The content of the resin having an aromatic compound at a portion thereof in the resist pattern thickening material can be decided according to the type and content of the resin, crosslinking agent and the like.

The organic solvent, when it is contained in the resist pattern thickening material, can enhance the solubility of the resin and crosslinking agent into the resist pattern thickening material.

The organic solvent is not particularly limited and may be suitably selected according to the purpose. Examples thereof are alcohol organic solvents, straight-chain ester organic solvents, cyclic ester organic solvents, ketone organic solvents, straight-chain ether organic solvents and cyclic ether organic solvents.

Examples of the alcohol organic solvents are methanol, ethanol, propyl alcohol, isopropyl alcohol, and butyl alcohol.

Examples of the straight-chain ester organic solvents are ethyl lactate and propylene glycol methyl ether acetate (PGMEA).

Examples of the cyclic ester organic solvents are lactone organic solvents such as γ-butyrolactone.

Examples of the ketone organic solvents are ketone organic solvents such as acetone, cyclohexanone, and heptanone.

Examples of the straight-chain ether organic solvents are ethylene glycol dimethyl ether.

Examples of the cyclic ether organic solvents are tetrahydrofuran and dioxane.

These organic solvents may be used alone, or two or more may be used in combination. Among these, from the viewpoint of thickening with fine precision, solvents having a boiling point of about 80 to 200° C. are preferred.

The content of the organic solvent in the resist pattern thickening material may be suitably determined according to the type and content of the resin, crosslinking agent, and surfactant.

The other components are not particularly limited as long as they do not interfere with the effects of the present invention, and may be suitably selected according to the purpose. Examples are various types of known additives such as crosslinking agents, thermal acid generating agents, and quenchers such as amine type, amide type, ammonium chloride type quenchers.

The content of the other components in the resist pattern thickening material may be suitably decided according to the type and content of the resin and crosslinking agent.

When the resist pattern thickening material is coated on the uppermost layer opening and made to undergo crosslinking, the uppermost layer opening is thickened, a surface layer is formed on the uppermost layer opening, and the diameter of the uppermost layer opening is reduced. As a result, a finer uppermost layer opening is formed which opening has the diameter smaller than the exposure limit of the light source of the exposure device used to form the uppermost layer opening without the use of electron beam patterning or the like.

At this time, the thickening amount of the uppermost layer opening, i.e., the reduction amount in the diameter of the uppermost layer opening may be controlled to within a desired range by suitably adjusting the composition, composition ratio, blending amount, concentration, viscosity, coating thickness, baking temperature and baking time of the resist pattern thickening material.

The composition, composition ratio, blending amount, concentration and viscosity of the resist pattern thickening material are not particularly limited and may be suitably selected according to the purpose.

From the viewpoint of controlling the thickening amount of the uppermost layer opening, i.e., the reduction amount of the diameter of the uppermost layer opening, the total content of components other than water in the resist pattern thickening material is normally 1 to 80% by mass, but preferably 5 to 50% by mass and more preferably 10 to 20% by mass.

Developing may be performed after the coating. If developing is performed, excess resist pattern thickening material which has not formed a mixing layer with the uppermost layer can be removed.

The developing may be performed by means of water or a weakly alkaline solution, but from the viewpoint of performing efficient developing at low cost, water developing is preferred.

The method of coating the resist pattern thickening material is not particularly limited and may be suitably selected from among coating methods known in the art according to the purpose, for example, spin-coating method. In the case of the spin-coating method, the condition is, for instance, a rotation speed of about 100 to 10,000 rpm, and the preferable rotation speed is 800 to 5000 rpm. The time is about 1 sec to 10 minutes, and 1 second to 90 seconds is more preferable.

The coating thickness in the coating is usually about 10 to 1,000 nm (about 100 to 10,000 Å), and the preferable thickness is about 200 to 500 nm (about 2,000 to 5,000 Å).

In the coating, the surfactant may be coated separately before coating the resist pattern thickening material without adding the surfactant into the resist pattern thickening material.

During or after the coating, it is preferable to prebake (heat and dry) the coated resist pattern thickening material from the viewpoint of efficiently mixing (impregnating) the resist pattern thickening material in the uppermost layer at the interface between the uppermost layer and resist pattern thickening material.

The prebake (heating and drying) conditions and method are not particularly limited as long as the uppermost layer is not softened, and may be suitably selected according to the purpose, but for example the temperature is about 40 to 120° C., preferably 70 to 100° C., and the time is about 10 seconds to 5 minutes, preferably 40 seconds to 100 seconds.

Moreover, after prebake (heating and drying), a crosslinking bake (crosslinking reaction) of the coated resist pattern thickening material is preferably performed from the viewpoint of efficiently promoting the crosslinking reaction of the mixing (impregnated) part at the interface between the uppermost layer and resist pattern thickening material.

The conditions and method for the crosslinking bake (crosslinking reaction) are not particularly limited and may be suitably selected according to the purpose. A higher temperature is normally employed than that employed for the prebake (heating and drying). The condition of the crosslinking bake (crosslinking reaction) is about 70 to 150° C. in the temperature and the preferable temperature is 90 to 130° C. The time is about 10 seconds to 5 minutes and the preferable time is 40 seconds to 100 seconds.

After the crosslinking bake (crosslinking reaction), a developing treatment is preferably given to the coated resist pattern thickening material. In this case, the part of the resist pattern thickening material which is not crosslinked or the part which is only weakly crosslinked with the uppermost layer (part with high water solubility) can be dissolved away, and a thickened resist pattern can be developed (obtained), which is preferred.

—Step of Forming Lowermost Layer Opening—

The step of forming a lowermost layer is a step which forms the lowermost layer opening in the lowermost layer of the laminated resist by transferring the uppermost layer opening formed in the photoresist to the lower layers of the photoresist and by penetrating through the laminated resist.

The method of transferring the uppermost layer opening to the lower layers (the upper layer, intermediate layer and lowermost layer) of the photoresist (uppermost layer) is not particularly limited and may be suitably selected according to the purpose. For example, etching is suitable.

The etching method is not particularly limited and may be suitably selected from methods known in the art. Examples thereof are dry etching, plasma ashing and the like. Among these, dry etching is preferred.

The etching conditions are not particularly limited and may be suitably selected according to the purpose.

The gas used in the etching is not particularly limited and may be suitably selected according to the purpose. Suitable examples thereof are an etching gas containing at least one moiety selected from among oxygen atoms, fluorine atoms and chlorine atoms in the molecule and an oxygen plasma.

Suitable example of the plasma ashing is an oxygen plasma ashing, which is particularly suitable when the upper layer is a polystyrene polymer-containing resist. In this case, the intermediate layer is exposed and developed, and the lowermost layer is also subjected to oxygen plasma ashing.

In the step of forming a lowermost layer opening, the uppermost layer in which the uppermost layer opening is formed functions as a mask, and layers other than the uppermost layer (the upper layer, intermediate layer and lowermost layer) exposed from the uppermost layer opening in the uppermost layer are removed by etching. As a result, the uppermost layer opening is transferred to the layers other than the uppermost layer, the laminated resist is penetrated, and the lowermost layer opening is formed in the lowermost layer of the laminated resist. At this time, the upper layer and intermediate layer are side-etched, and the opening diameter is larger than that of the uppermost layer opening. The opening parts formed in this upper layer and intermediate layer become spaces for forming the overgate part.

In the present invention, after the step of forming a lowermost layer opening and before the step of reducing a lowermost layer opening, a step of side-etching the opening in the intermediate layer using an intermediate layer dissolving solution, and a step of performing heat treatment by subjecting the lowermost layer to heat treatment to thereby form a taper structure in the lowermost layer opening, may be included.

When the step of side-etching is performed, the intermediate layer is side-etched and a space for forming the overgate part is retained in the opening formed in the laminated resist, which is preferred.

—Step of Reducing Lowermost Layer Opening—

The step of reducing a lowermost layer opening is a step which reduces the size of the lowermost layer opening in the lowermost layer of the laminated resist.

The method of reducing the size of the lowermost layer opening is not particularly limited and may be suitably selected according to the purpose. Examples thereof are a method of reducing the opening diameter by coating the resist pattern thickening material on the lowermost layer opening or a method of reducing the opening diameter by heating the lowermost layer opening (part). Among these, the method of reducing the opening diameter by coating the resist pattern thickening material on the lowermost layer opening is preferred. The method of reducing the opening diameter by heating the lowermost layer opening (part) may be suitably employed when the lowermost layer is formed from a polymethyl methacrylate (PMMA) resist. The heating temperature is not particularly limited and may be suitably selected according to the purpose. When the lowermost layer is formed from a polymethyl methacrylate resist, for example, 136 to 141° C. is preferred.

In the step of reducing a lowermost layer opening, the lowermost layer opening in the lowermost layer of the laminated resist is thickened, and its opening size is reduced. In the step of reducing a lowermost layer opening, the resist pattern thickening material mentioned above may be used. In this case, when the resist pattern thickening material is coated on the lowermost layer opening and crosslinked, the lowermost layer opening is thickened, a surface layer is formed on the lowermost layer opening, and the diameter (size) of the lowermost layer opening is thereby reduced. As a result, a finer lowermost layer opening is formed which opening is smaller than the exposure limit of the light source of the exposure apparatus used to form the uppermost layer opening without the use of electron beam patterning.

At this time, the thickening amount of the lowermost layer opening, i.e., the reduction amount in the diameter of the lowermost layer opening may be controlled to within a desired range by suitably adjusting the composition, composition ratio, blending amount, concentration, viscosity, coating thickness, baking temperature and baking time of the resist pattern thickening material.

The composition, composition ratio, blending amount, concentration and viscosity of the resist pattern thickening material are not particularly limited and may be suitably selected according to the purpose.

From the viewpoint of controlling the thickening amount of the lowermost layer opening, i.e., the reduction amount of the diameter of the lowermost layer opening, the total content of components other than water in the resist pattern thickening material is normally 1 to 80% by mass, but preferably 5 to 50% by mass and more preferably 10 to 20% by mass.

—Step of Forming T-Shaped Electrode—

The step of forming a T-shaped electrode is a step which forms the T-shaped electrode in the opening formed through the laminated resist.

The method of forming the T-shaped electrode is not particularly limited and may be suitably selected according to the purpose. Suitable example thereof is vapor deposition.

The metal material which is vapor-deposited by vapor deposition may be suitably selected from among those known in the art as electrode materials, for example, Ti, Pt and Au. These may be used alone, or two or more may be used in combination. These metals may be laminated to form the T-type electrode. In this case, the aspects forming the T-type electrode by lamination of, for instance, Ti, Pt, and Au are given as the preferable examples.

After forming the T-shaped electrode, the laminated resist must be removed, and the laminated resist may be removed by, for example, the lift-off method or etching. Among these, the lift-off method is preferred. The conditions of these methods are not particularly limited and may be suitably selected from known conditions in the art.

In the step of forming a T-shaped electrode, a T-shaped electrode is formed in the opening part formed through the laminated resist. Specifically, the base of the fine T-shaped electrode is formed in a part of the lowermost layer opening, and a space to form the overgate part is then formed in the opening in the intermediate layer which was side-etched. The laminated resist is then removed to obtain the fine T-shaped electrode.

Next, specific examples of the method used to manufacture the fine T-shaped electrode will be the described referring to the drawings.

(First Aspect)

Figure 2:
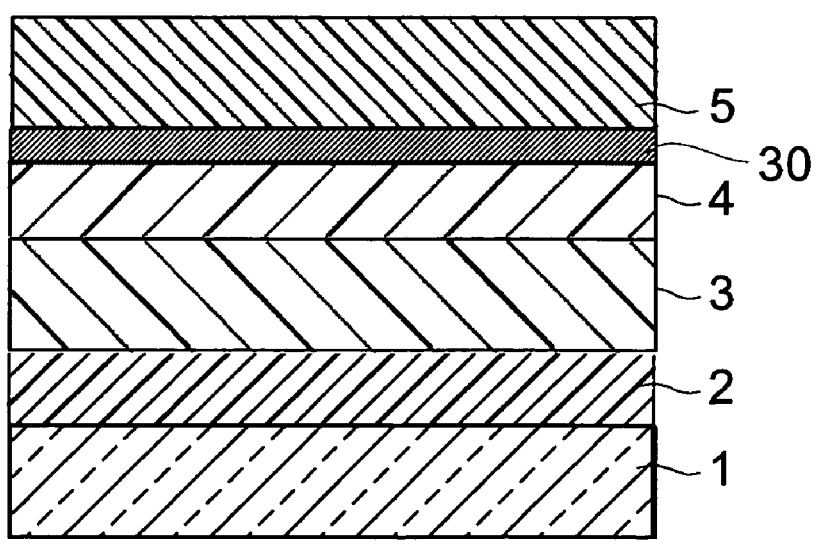
FIG. 2 is a schematic diagram describing another example of the step of forming a laminated resist in the method of manufacturing a fine T-shaped electrode according to the present invention.

As shown in FIG. 1, a laminated resist was formed by sequentially coating a PMMA resist 2 (polymethyl methacrylate resist), PMGI resist 3 (resist having polymethyl glutarimide as its main component), polystyrene polymer-containing resist 4 (electron beam resist containing polystyrene polymer and acrylic resin), and an i line resist 5, on a surface where fine T-shaped electrode is formed 1 (herein, semiconductor surface). This is the step of forming a laminated resist. As shown in FIG. 2, an insulating layer 30 may be provided between the polystyrene polymer-containing resist 4 (electron beam resist containing polystyrene polymer and acrylic resin) and i line resist 5.

Figure 3:
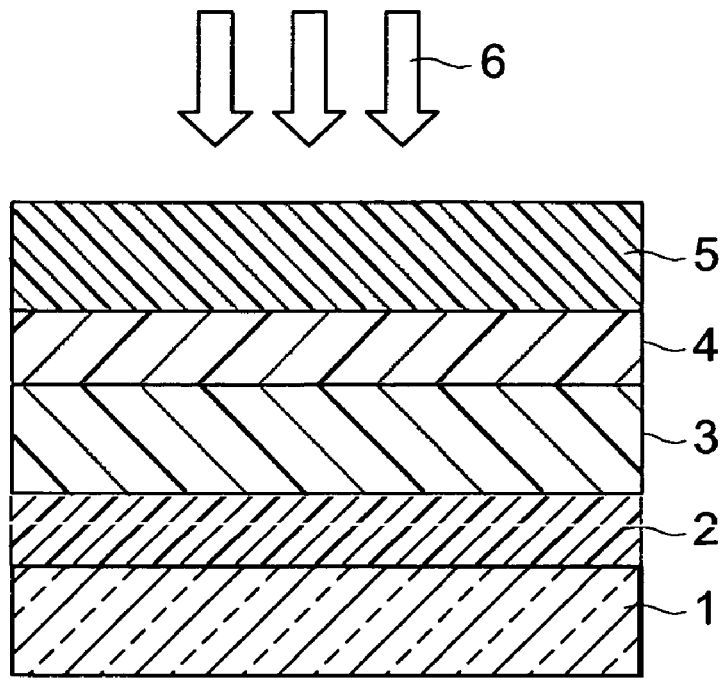
FIG. 3 is a schematic diagram describing an example of a step of forming an uppermost layer opening in the method of manufacturing a fine T-shaped electrode according to the present invention.
Figure 4:
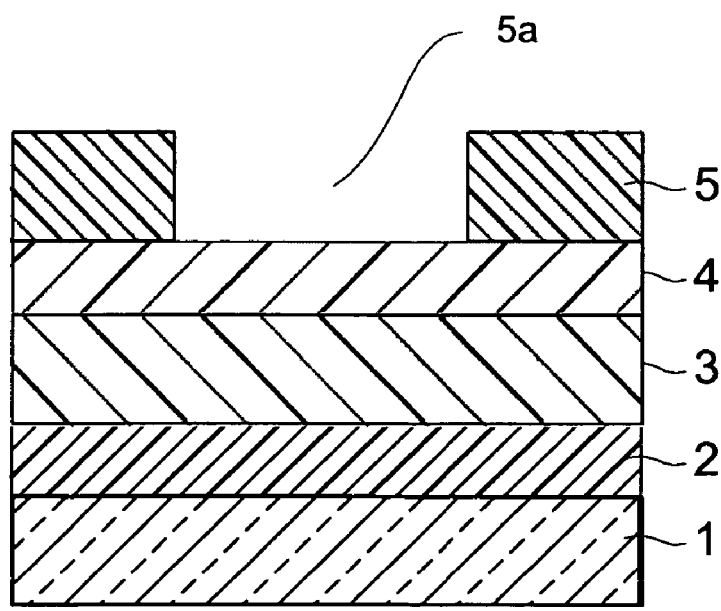
FIG. 4 is a schematic diagram describing an example in which the uppermost layer opening is formed by the step of forming an uppermost layer opening in the method of manufacturing a fine T-shaped electrode according to the present invention.

Next, as shown in FIG. 3, an i line 6 was selectively irradiated on the i line resist 5 to pattern an opening for forming the fine T-shaped electrode by photolithography. As shown in FIG. 4, an opening 5a was thereby formed on the i line resist 5. The opening dimensions (opening diameter) of the opening 5a depend on the exposure conditions, but herein, they were about 0.35 µm to 0.50 µm. This opening 5a is the uppermost layer opening. This is the step of forming an uppermost layer opening.

Figure 5:
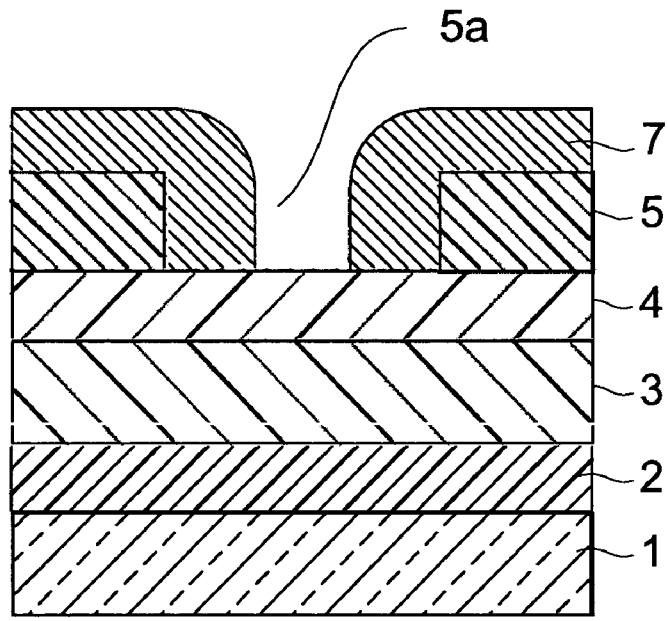
FIG. 5 is a schematic diagram describing an example of a step of reducing an uppermost layer opening in the method of manufacturing a fine T-shaped electrode according to the present invention.

Next, the resist pattern thickening material was coated on the i line resist 5 and prebaked, and the i line resist 5 was mixed with the resist pattern thickening material at the interface with the opening 5a to form a mixing layer 7. Subsequently, by performing a crosslinking bake at a temperature higher than the prebake, the mixing layer 7 was crosslinked. In this state, when developing was performed using water, IPA or a weakly alkaline solution, the resist pattern thickening material other than the crosslinked mixing layer 7 was dissolved away. As a result, as shown in FIG. 5, the opening dimensions (opening diameter) of the opening 5a were reduced. This is the step of reducing an uppermost layer opening.

In the step of reducing an uppermost layer opening, by adjusting the type, composition, composition ratio, blending ratio and concentration of the resin and crosslinking agent contained in the resist pattern thickening material, by suitably varying the coating conditions of the resist pattern thickening material, or by adjusting the temperature and time of the bake performed after coating, the thickness of the mixing layer and crosslinking degree of the mixing layer could be varied, the amount dissolved by the developing treatment of resist pattern thickening material could be varied, and the reduction of the opening dimensions (opening diameter) of the opening 5a could be controlled to within a desired extent.

Specifically, when the resist pattern thickening material containing polyvinyl acetal (corresponding to the resin) and an uril derivative (corresponding to the crosslinking agent) in a total amount of 5 to 40% by weight, the opening dimensions (opening diameter) of the opening 5a were reduced from an initial value of 0.5 µm to a range of 0.07 to 0.23 µm.

Figure 6:
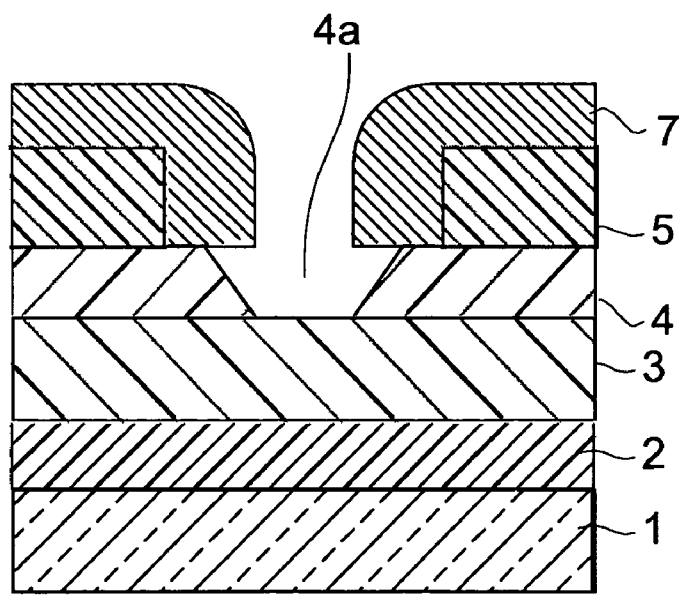
FIG. 6 is a schematic diagram describing an example (No. 1) of a step of forming a lowermost layer opening in the method of manufacturing a fine T-shaped electrode according to the present invention.
Figure 7:
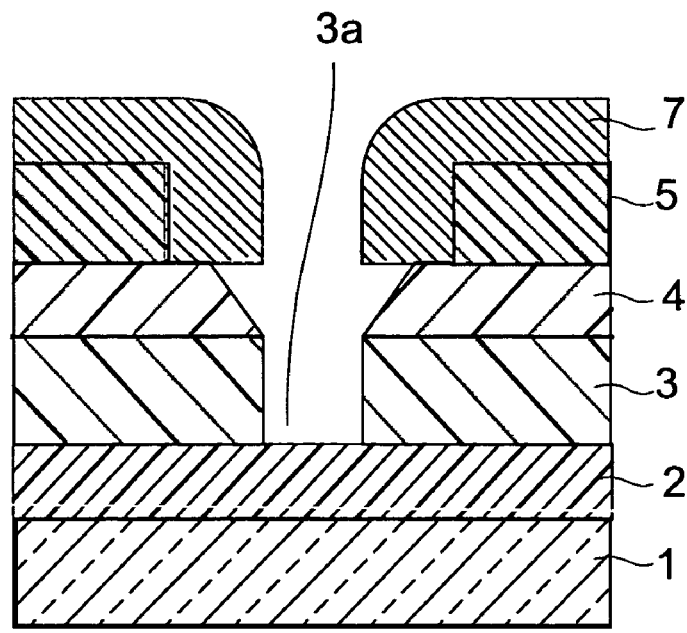
FIG. 7 is a schematic diagram describing an example (No. 2) of the step of forming a lowermost layer opening in the method of manufacturing a fine T-shaped electrode according to the present invention.
Figure 8:
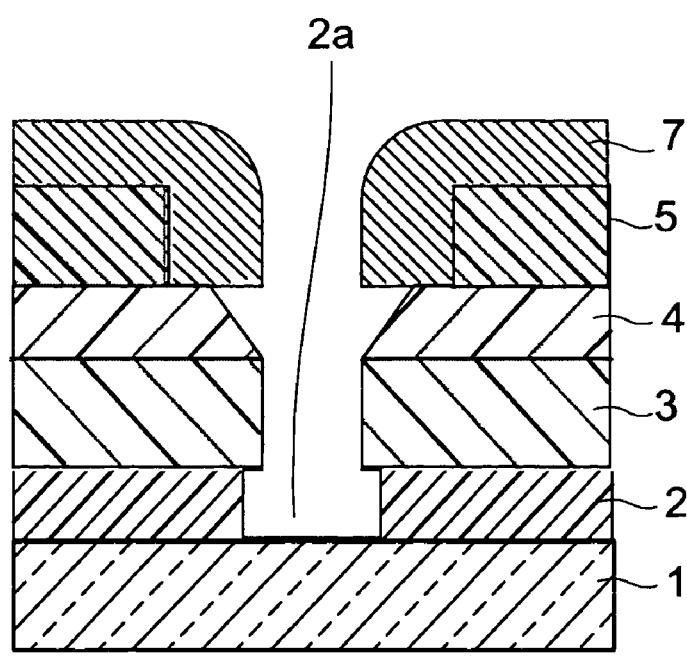
FIG. 8 is a schematic diagram describing an example (No. 3) of the step of forming a lowermost layer opening in the method of manufacturing a fine T-shaped electrode according to the present invention.

Next, when dry etching was performed using an etching gas containing fluorine atoms from the opening 5a, as shown in FIG. 6, the part of the polystyrene polymer-containing resist 4 exposed from the opening 5a and its vicinity was removed by the etching to form an opening 4a. At this time, the opening formed in the polystyrene polymer-containing resist 4 had a taper structure. Dry etching was continued, and as shown in FIG. 7, the layer of the PMGI resist 3 exposed from the opening 5a was removed by the etching to form an opening 3a. Next, dry etching was continued further, and as shown in FIG. 8, the layer of the PMMA resist 2 exposed from the opening 5a was removed by the etching. As a result, the opening 5a was successively transferred to the multi-layer resist comprising the PMMA resist 2, the PMGI 3 and the poly styrene polymer-containing resist 4 to form an opening 2a. Part of the surface where a fine T-shaped electrode is to be formed 1 is thereby exposed from the opening 2a. While the layer of the PMMA resist 2 was etched, the polystyrene polymer-containing resist 4 was side-etched, and the PMGI 3 and PMMA resist 2 situated underneath it were removed by etching almost perpendicularly. The opening dimensions (opening diameter) of the layer of the PMMA resist 2 were 0.21 to 0.37 µm. This is the step of forming a lowermost layer opening. The processes shown in FIGS. 5 to 8 is actually performed continuously.

Next, to form the overgate part of the fine T-shaped electrode, the layer of the PMGI 3 which is the intermediate layer in the laminated resist was side-etched using a PMGI dissolving solution such as an aqueous solution of tetramethyl ammonium hydroxide.

Figure 9:
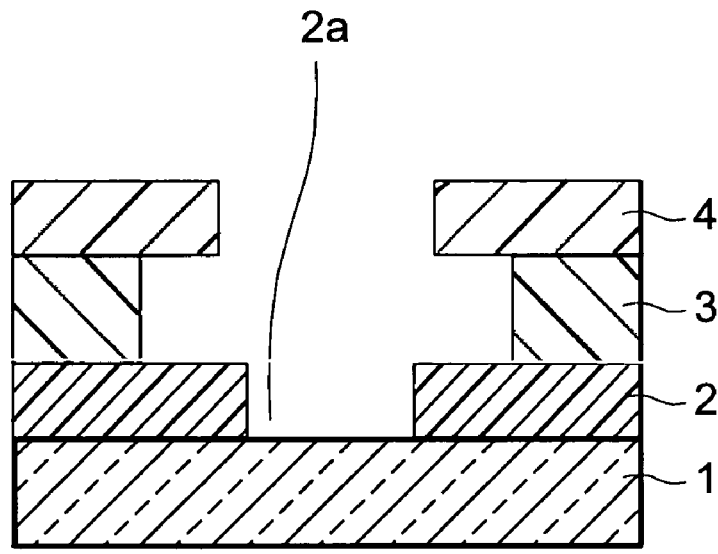
FIG. 9 is a schematic diagram describing an example of a step of side-etching in the method of manufacturing a fine T-shaped electrode according to the present invention.

The side-etching amount of the layer of the PMGI 3 can be easily controlled by adjusting the treatment time with the PMGI dissolving solution. When side-etching is performed, the i line resist 5 is also dissolved, so as shown in FIG. 9, the opening dimensions (opening diameter) of the layer of PMGI 3 became larger than the opening dimensions (opening diameter) of the layers of the PMMA resist 2 and polystyrene polymer-containing resist 4. This is the step of side-etching.

Figure 10:
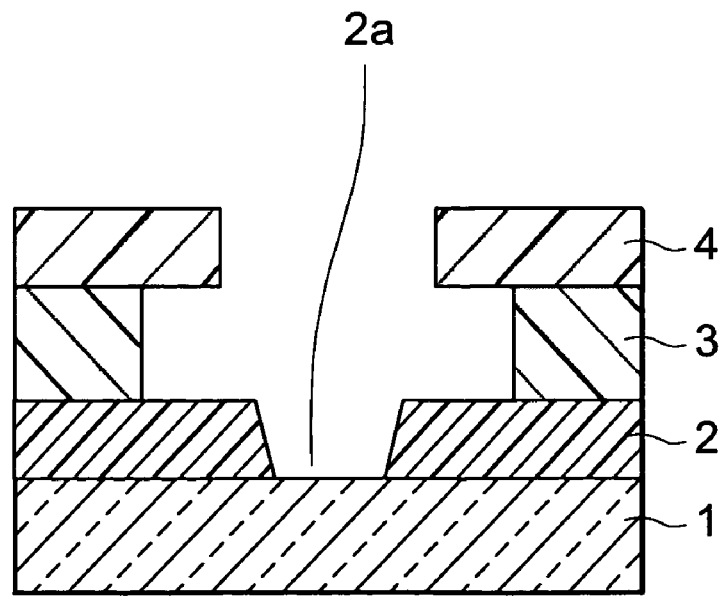
FIG. 10 is a schematic diagram describing an example of a step of performing heat treatment in the method of manufacturing a fine T-shaped electrode according to the present invention.

Next, heat treatment was performed, and as shown in FIG. 10, the opening of the PMMA resist 2 was thereby given a taper structure. This is the step of performing heat treatment.

Figure 11:
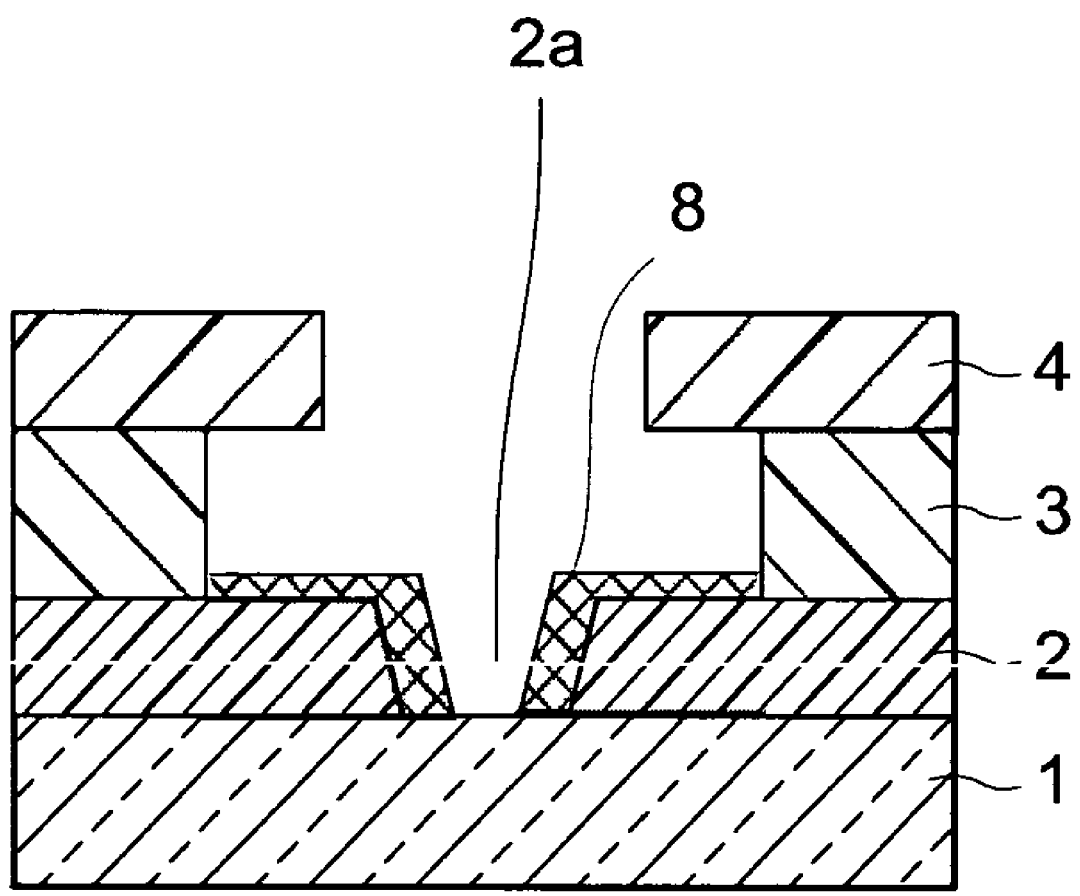
FIG. 11 is a schematic diagram describing an example of a step of reducing a lowermost layer opening in the method of manufacturing a fine T-shaped electrode according to the present invention.

Subsequently, a resist pattern thickening material 8 was coated on the opening of the PMMA resist 2, and after prebake, a crosslinking bake was performed at a higher temperature than that of prebake in the same way as in reducing the opening of the i line resist 5. As shown in FIG. 11, the opening dimensions (opening diameter) of the opening 2a of the PMMA resist 2 were thereby reduced. This is the step of reducing a lowermost layer opening.

Figure 12:
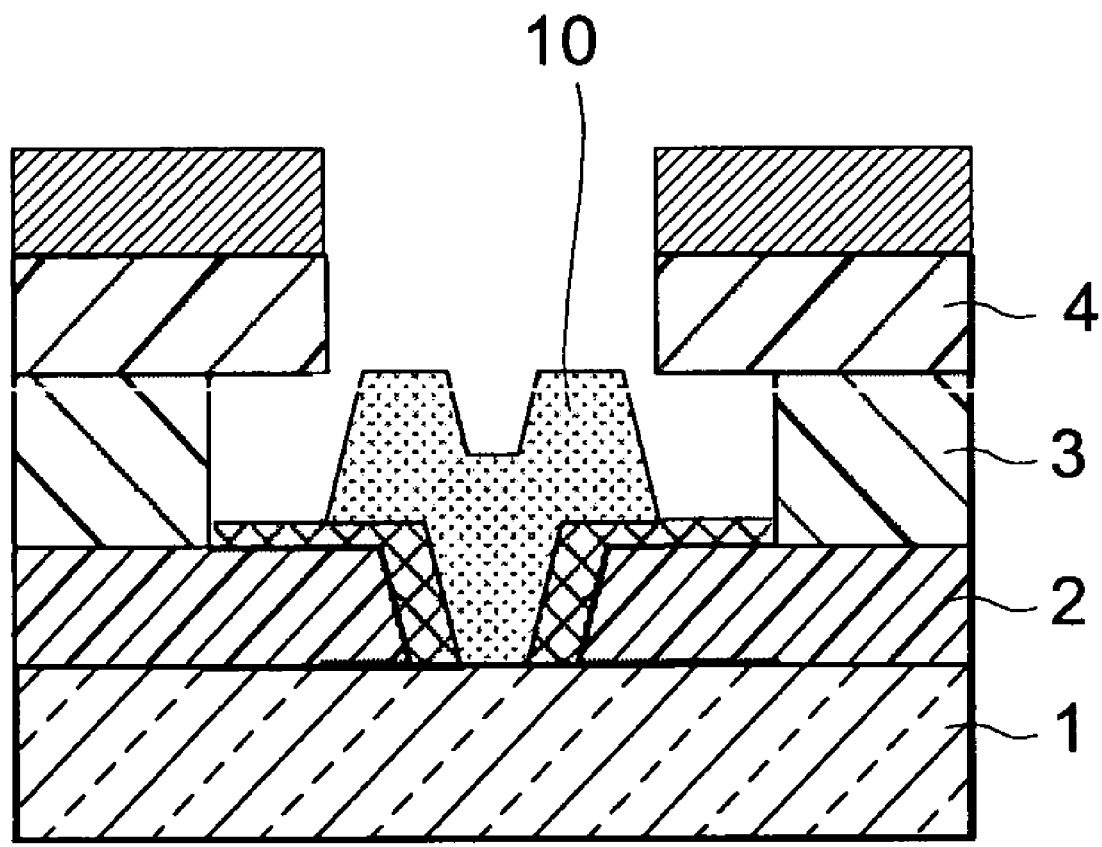
FIG. 12 is a schematic diagram describing an example (No. 1) of a step of forming an electrode in the method of manufacturing a fine T-shaped electrode according to the present invention.
Figure 13:
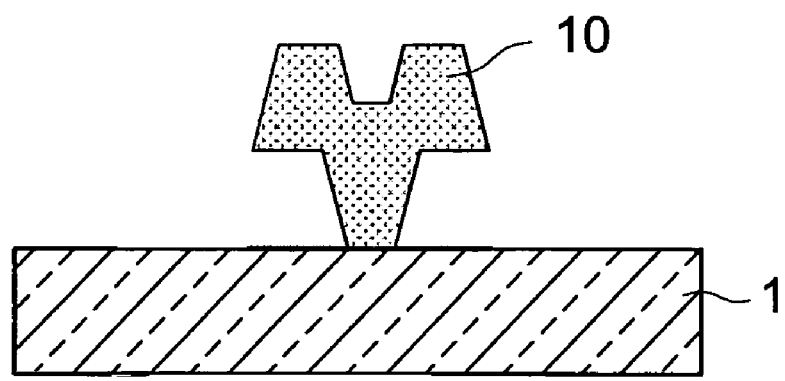
FIG. 13 is a schematic diagram describing an example (No. 2) of the step of forming an electrode in the method of manufacturing a fine T-shaped electrode according to the present invention.

Next, as shown in FIG. 12, a fine T-shaped electrode 10 was formed by performing metal vapor deposition of the electrode material onto the surface where a fine T-shaped electrode is to be formed 1 which surface was exposed from the opening 2a. At this time, the metal of the electrode material was vapor-deposited also on the polystyrene polymer-containing resist 4. When the laminated resist was dissolved and peeled away by the lift-off method, as shown in FIG. 13, the fine T-shaped electrode 10 was left on the surface where a fine T-shaped electrode is to be formed 1. This is the step of forming a T-shaped electrode.

In the step of reducing a lowermost layer opening, by adjusting the type, composition, composition ratio, blending ratio and concentration of the resin and crosslinking agent contained in the resist pattern thickening material, by suitably varying the coating conditions of the resist pattern thickening material, or by adjusting the temperature and time of the bake performed after coating, the thickness of the mixing layer and crosslinking degree of the mixing layer could be varied, the amount of resist pattern thickening material which is dissolved by the developing treatment could be varied, and the reduction of the opening dimensions (opening diameter) of the opening 5a could be controlled to within a desired extent.

Specifically, when the resist pattern thickening material contained polyvinyl acetal (corresponding to the resin) and an uril derivative (corresponding to the crosslinking agent) in a total amount of 10 to 20% by weight, the initial opening dimensions (opening diameter) of the opening 2a which were 0.10 to 0.40 µm, were reduced to the region of 0.02 to 0.20 µm. In this way, the opening dimensions (opening diameter) of the PMMA resist 2 which determine the gate length could be formed to about 0.1 µm or less.

(Second Aspect)

In the second aspect, the procedure was identical to that of the first aspect up to the step of reducing an uppermost layer opening.

Next, ashing by an oxygen plasma was performed from the opening 5a of the i line resist 5 in FIG. 5, and as shown in FIG. 6, the opening 4a of the polystyrene polymer-containing resist 4 was thereby formed. Next, ultraviolet light was irradiated by an excimer xenon lamp to the opening 4a. When the PMGI 3 is irradiated by ultraviolet light, the solubility of the PMGI 3 into the developing solution is increased, so after ultraviolet light irradiation, treatment was performed with the PMGI developing solution, and the opening 3a in the PMGI 3 was thereby formed (FIG. 7). Next, ashing by an oxygen plasma was performed from the opening 3a of the PMGI 3, and as shown in FIG. 8, the opening 2a in the PMMA resist 2 was thereby formed. This is the step of forming a lowermost layer opening.

In the second aspect, in the step of forming a lowermost layer opening, an oxygen asher is used for etching, so the lowermost opening can be formed more easily and at lower cost than by the dry etching in the first aspect.

Next, the PMGI 3 which is the intermediate layer of the laminated resist, was side-etched using a PMGI dissolving solution such as tetramethyl ammonium hydroxide (TMAH). As shown in FIG. 9, the opening dimensions (opening diameter) of the layer of the PMGI 3 became larger than the opening dimensions (opening diameter) of the layers of the PMMA resist 2 and polystyrene polymer-containing resist 4. This is the step of side-etching.

The step of reducing a lowermost layer opening and step of forming an electrode were performed in the same way as in first aspect. Thus, a fine T-shaped electrode was formed as shown in FIG. 13.

(Third Aspect)

Figure 14:
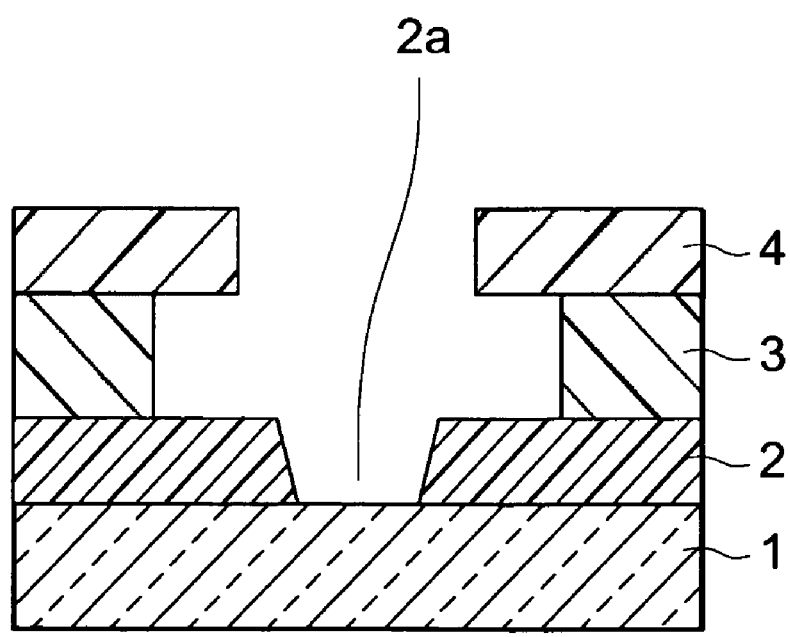
FIG. 14 is a schematic diagram describing another example of the step of performing heat treatment in the method of manufacturing a fine T-shaped electrode according to the present invention.

In the third aspect, the procedure was identical to that of the first aspect up to the step of performing heat treatment. Due to the step of performing heat treatment, as shown in FIG. 14, the opening 2a of the PMMA resist 2 was given a taper structure.

Figure 15:
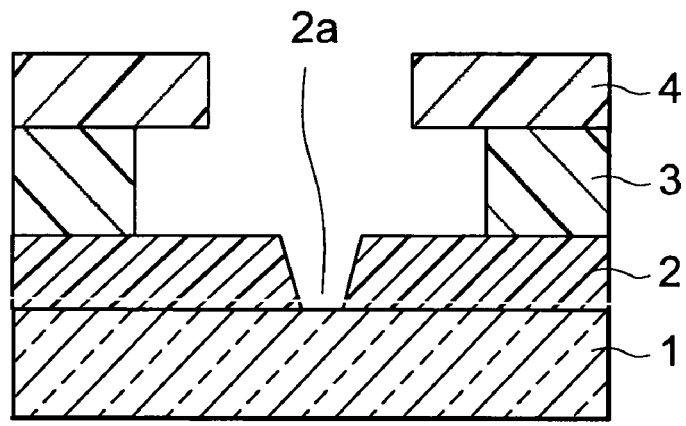
FIG. 15 is a schematic diagram describing another example of the step of reducing a lowermost layer opening in the method of manufacturing a fine T-shaped electrode according to the present invention.

After giving the opening 2a of the PMMA resist 2 a taper structure, heat treatment was further performed, and as shown in FIG. 15, the opening 2a of the PMMA resist 2 was reduced, and the opening dimensions (opening diameter) were reduced. This is the step of reducing a lowermost layer opening. The heat treatment conditions in the step of reducing a lowermost layer opening differ from the conditions under which the opening 2a is given a taper structure in the step of performing heat treatment, but by suitably adjusting the treatment temperature and time, the reduction amount of the opening $2a$ of the PMMA resist 2 can be controlled to a desired value.

When the treatment time was 5 to 7 minutes and the treatment temperature was 136 to 141° C. in the heat treatment of the step of reducing a lowermost layer opening, the opening dimensions (opening diameter) of the opening $2a$ were reduced to the region of greater than 0 to 0.2 μm. In this way, the opening dimensions (opening diameter) of the PMMA resist 2 which determine the gate length, could be formed to approximately 0.1 μm or less.

Figure 16:
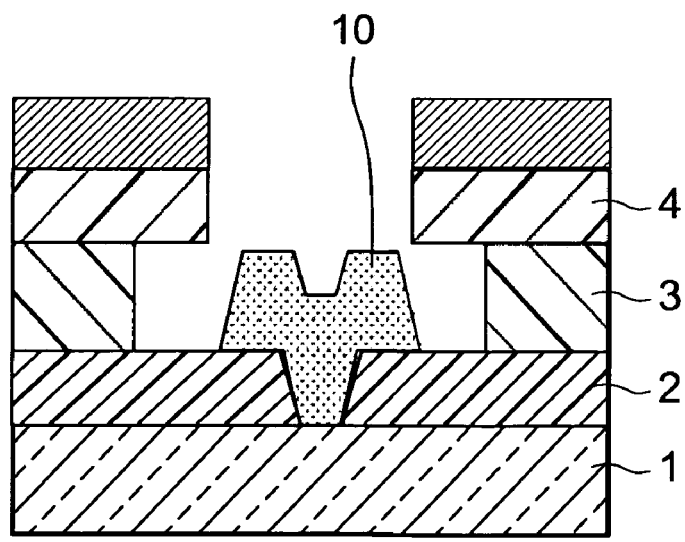
FIG. 16 is a schematic diagram describing another example (No. 1) of the step of forming an electrode in the method of manufacturing a fine T-shaped electrode according to the present invention.
Figure 17:
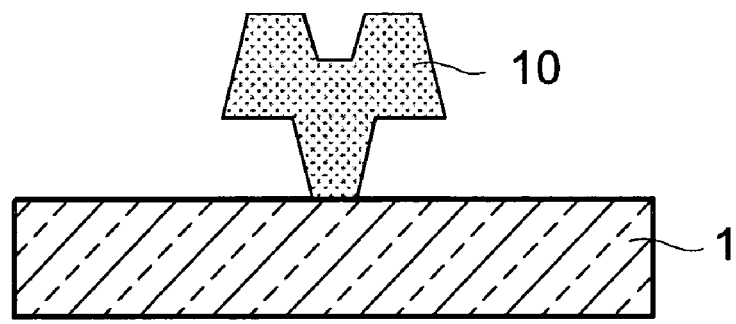
FIG. 17 is a schematic diagram describing another example (No. 2) of the step of forming an electrode in the method of manufacturing a fine T-shaped electrode according to the present invention.

The step of forming an electrode was performed in the same way as in the first aspect. Thus, a fine T-shaped electrode was formed as shown in FIGS. 16 and 17.

The present invention will be illustrated in further detail with reference to several examples below, which are not intended to limit the scope of the present invention.

Example 1

The step of forming a laminated resist was performed as described below. Specifically, as shown in FIG. 1, the PMMA resist 2 (Zeon Corp.: ZEP-2000) was formed to a thickness of 260 nm (2,600 Å), the PMGI 3 (MicroChem Corp.: PMGI-SF8) was formed to a thickness of 550 nm (5,500 Å), the polystyrene polymer-containing resist 4 (Zeon Corp.: ZEP-520) was formed to a thickness of 270 nm (2,700 Å), and the i line resist 5 (Sumitomo Chemical Co., Ltd.: PFI-32) was formed to a thickness of 850 nm (8,500 Å) by coating them in this order on a GaAs substrate which is the surface where a fine T-shaped electrode is to be formed 1 so as to form a laminated resist.

Next, the step of forming an uppermost layer opening was performed. Specifically, as shown in FIG. 3, the i line 6 was selectively irradiated (exposure time 450 msec.) to the i line resist 5 by i line photolithography, and as shown in FIG. 4, the opening $5a$ for forming the fine T-shaped electrode was thereby formed. The dimensions of the opening $5a$ were 0.43 μm.

Next, the step of reducing an uppermost layer opening was performed. First, the resist pattern thickening material was prepared. Specifically, the resist pattern thickening material contained 16 parts by mass of polyvinyl acetal resin (Sekisui Chemical Co., Ltd.: KW-3) as the resin, 1 to 1.5 parts by mass of tetramethoxy methyl glycoluril (Sekisui Chemical Co., Ltd.) as the crosslinking agent, and 0.06 to 0.3 parts by mass of a polyoxyethylene monoalkyl ether surfactant (Asahi Denka Kogyo K.K.: TN-80, non-ionic surfactant) as the surfactant. A mixed solution of pure water (de-ionized water) and isopropyl alcohol (mass ratio of pure water (de-ionized water):isopropyl alcohol=98.6:0.4) was used as the main solvent component excluding the resin, crosslinking agent and surfactant. Next, as shown in FIG. 4, this resist pattern thickening material was coated by spin coating at 3000 rpm for 60 seconds, prebaked at 85° C. for 70 seconds, and as shown in FIG. 5, the mixing layer 7 comprising the i line resist 5 and resist pattern thickening material was formed on the surface of the opening $5a$. Subsequently, a crosslinking bake was performed at 95° C. for 70 seconds so as to crosslink the mixing layer 7. Developing treatment was then performed with water for 60 seconds, and the resist pattern thickening material other than the crosslinked part was thereby dissolved away. As a result, the opening dimensions of the opening $5a$ were 0.21 μm, and the opening dimensions of the opening $5a$ were reduced by 0.22 μm.

Next, the step of forming a lowermost layer was performed. Dry etching was performed using a mixture of $SF_6$ and $CHF_3$ from the opening $5a$. The dry etching conditions were a pressure of 0.5 Pa and a target etching film thickness of 1.3 μm. First, as shown in FIG. 6, the opening $4a$ was formed in the polystyrene polymer-containing resist 4. The opening $4a$ had a taper structure. Dry etching was continued to form the opening $3a$ in the PMGI 3 as shown in FIG. 7, and the opening $2a$ in the PMMA resist 2 as shown in FIG. 8. The opening dimensions of the opening $2a$ were 0.27 μm.

Next, the step of side-etching was performed. Specifically, the opening $3a$ of the PMGI 3 which is the intermediate layer of the laminated resist was treated with an aqueous solution of tetramethyl ammonium hydroxide (TMAH) which is a PMGI dissolving solution for 40 seconds, and as shown in FIG. 9, the opening $3a$ was thereby side-etched. The side-etching amount of the opening $3a$ was 0.20 μm, which was a sufficient amount for making lift-off easy.

Next, the step of performing heat treatment was performed. By performing heat treatment at 138° C. for 5 minutes on the laminated resist, the opening $2a$ of the PMMA resist 2 was given a tapered structure as shown in FIG. 10.

Next, the step of reducing a lowermost layer opening was performed. Specifically, the resist pattern thickening material used in the step of reducing an uppermost layer opening was coated at 3000 rpm for 60 seconds to form the mixing layer 8. After prebake at 85° C. for 70 seconds, a crosslinking bake was performed at 95° C. for 70 seconds to crosslink the mixing layer 8 as in the case of the step of reducing an uppermost layer opening. Developing treatment was then performed with water for 60 seconds, and the resist pattern thickening material other than the crosslinked part was thereby dissolved away. As a result, as shown in FIG. 11, the opening $2a$ was reduced so that the opening dimensions of the opening $2a$ were 0.11 μm. The reduction amount of the opening dimensions of the opening $2a$ was 0.16 μm.

Next, the step of forming an electrode was performed. Specifically, as shown in FIG. 12, an electrode comprising Ti having a thickness of 1 nm (10 Å), Pt having a thickness of 30 nm (300 Å) and Au having a thickness of 500 nm (5,000 Å) was vapor-deposited by vapor deposition (electron gun heating or resistance heating in a vacuum chamber at $2 \times 10^{-7}$ Torr or less). Subsequently, the laminated resist was removed by the lift-off method (immersion in a bath of N-methyl-2-pyrrolidone (Tokyo Ohka Kogyo Co., Ltd.) at 75° C. for 2 hours), and as shown in FIG. 13, a fine T-shaped electrode having a gate length of about 0.1 μm, was thereby formed.

Thus, the fine T-shaped electrode was manufactured.

Example 2

The procedure was identical to Example 1 up to the step of reducing an uppermost layer opening.

Next, the step of forming a lowermost layer opening was performed. Specifically, ashing by an oxygen plasma was performed at 300 W for 5 minutes from the opening $5a$ of the i line resist 5 in FIG. 5, and as shown in FIG. 6, the opening $4a$ of the polystyrene polymer-containing resist 4 was thereby formed. Next, ultraviolet light was irradiated by an excimer xenon lamp to the opening $4a$ for 10 seconds. When the PMGI 3 is irradiated by ultraviolet light, the solubility into the developing solution is increased, so after ultraviolet light irradiation, treatment was performed with an aqueous solution of tetramethyl ammonium hydroxide (TMAH) as the PMGI developing solution for 40 seconds, and the opening $3a$ in the PMGI 3 was thereby formed (FIG. 7). Next, ashing by an oxygen plasma was performed at 300 W for 5 minutes from the opening $3a$ of the PMGI 3, and as shown in FIG. 8, the opening 2a in the PMMA resist 2 was thereby formed. The opening dimensions of the opening 2a were 0.30 μm.

The step of reducing a lowermost layer opening and step of forming an electrode were performed in an identical way to that of first aspect, and as shown in FIG. 13, a fine T-shaped electrode having a gate length of about 0.1 μm, was thereby formed.

Example 3

The processing was identical to Example 1 up to the step of performing heat treatment.

Next, the step of reducing a lowermost layer opening was performed. Specifically, as shown in FIG. 14, the opening dimensions were reduced as shown in FIG. 15 by performing heat treatment on the opening 2a at 141° C. for 7 minutes.

The step of forming an electrode was performed in the same way as in Example 1. Thus, a fine T-shaped electrode having a gate length of about 0.1 μm was formed as shown in FIG. 13.

Example 4

In Example 4, the fine T-shaped electrode was formed using the fine T-shaped electrode manufacturing method of the present invention in an element having a gate recess structure commonly employed for FET, HEMT and the like.

Figure 18:
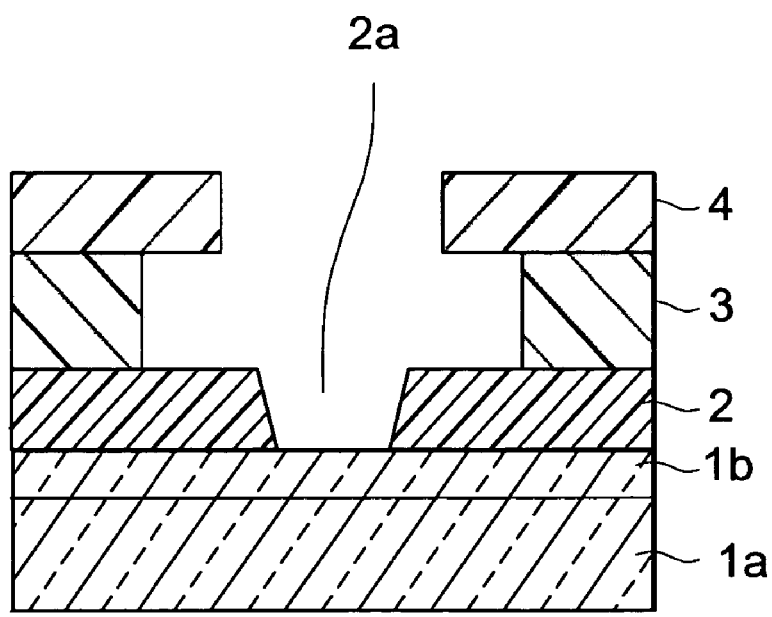
FIG. 18 is a schematic diagram describing an example of forming a T-shaped electrode in an element having a gate recess structure, which is an example of the step of performing heat treatment in the method of manufacturing a fine T-shaped electrode according to the present invention.

In Example 1, instead of the GaAs substrate which is the surface where a fine T-shaped electrode is to be formed 1, as shown in FIG. 18, InAlAs as a Schottky layer 1a and InGaAs having a thickness of 30 nm (300 Å) as a cap layer 1b for forming a recess laminated in this order were used as the surface where a fine T-shaped electrode is to be formed 1. The subsequent procedure was identical to that of Example 1 up to the step of forming a lowermost layer opening.

Next, the step of performing heat treatment was performed at 138° C. for 5 minutes, and as shown in FIG. 18, the opening 2a of the PMMA resist 2 was given a taper structure.

Figure 19:
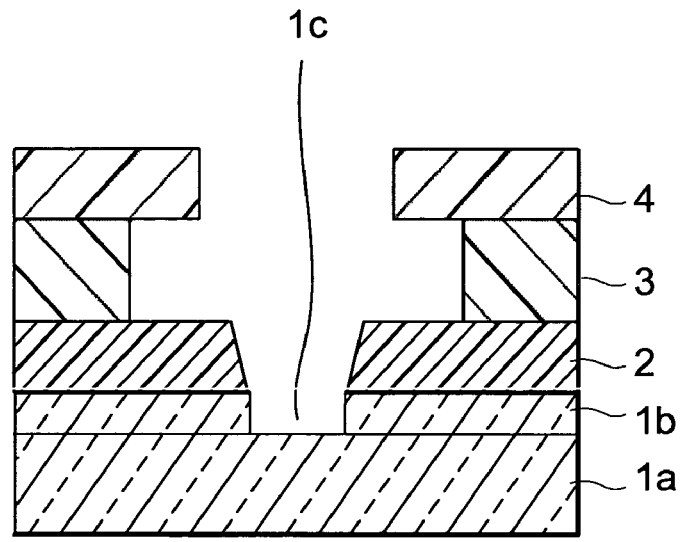
FIG. 19 is a schematic diagram describing an example of forming a T-shaped electrode in an element having a gate recess structure, which is an example of a step of forming a gate recess part in the method of manufacturing a fine T-shaped electrode according to the present invention.

Next, the InGaAs which is the cap layer 1b was etched by an phosphate etchant from the opening 2a of the PMMA resist 2, and as shown in FIG. 19, a gate recess part opening 1c was thereby formed. At this time, if the opening 2a of the PMMA resist 2 was about 0.25 μm, the opening dimensions of the gate recess opening were about 0.30 μm.

Figure 20:
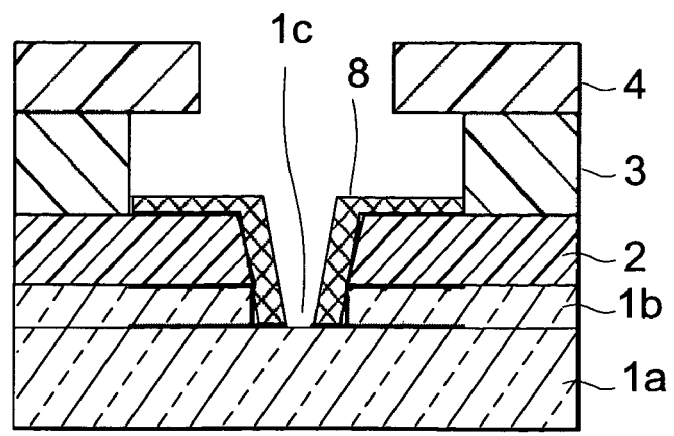
FIG. 20 is a schematic diagram describing an example of forming a T-shaped electrode in an element having a gate recess structure, which is an example of the step of reducing a lowermost layer opening in the method of manufacturing a fine T-shaped electrode according to the present invention.

Next, as shown in FIG. 20, the resist pattern thickening material used in Example 1 was coated on the opening 2a and the gate recess part opening at 3000 rpm for 60 seconds to form the mixing layer 8, a prebake was performed at 85° C. for 70 seconds, and a crosslinking bake was performed at 95° C. for 70 seconds so as to crosslink the mixing layer 8 in the same way as in the step of reducing a lowermost layer opening of Example 1. A developing treatment was performed in the same way as in Example 1, and as shown in FIG. 20, the opening 2a of the PMMA resist 2 was thereby reduced. The opening dimensions of the opening 2a were about 0.12 μm, and the reduction amount of the opening 2a was 0.19 μm.

Figure 21:
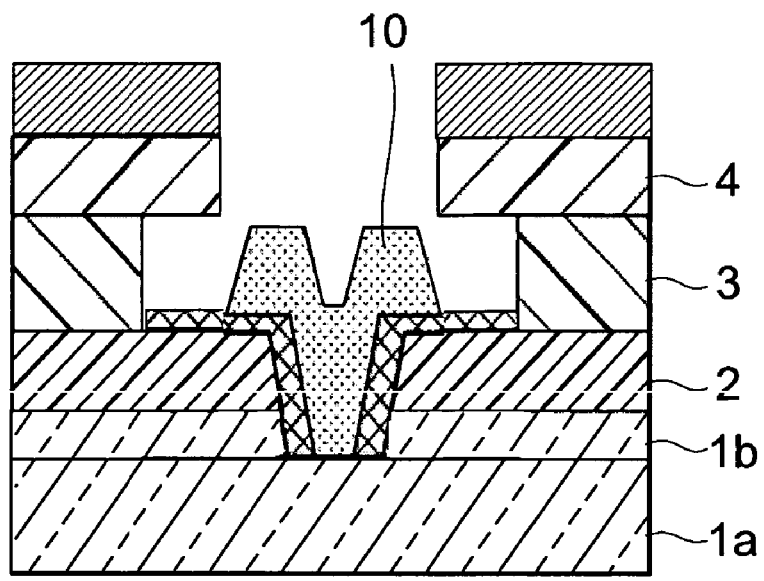
FIG. 21 is a schematic diagram describing a an example of forming a T-shaped electrode in an element having a gate recess structure, which is an example (No. 1) of the step of forming an electrode in the method of manufacturing a fine T-shaped electrode according to the present invention.
Figure 22:
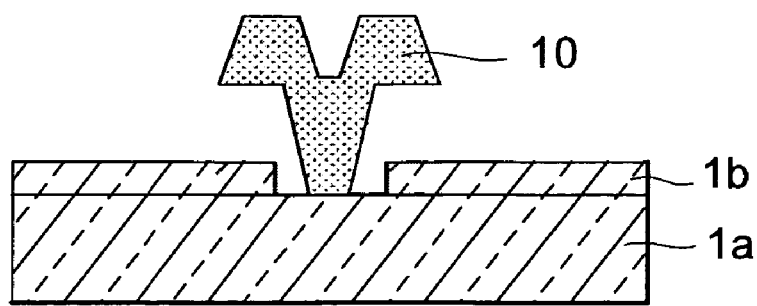
FIG. 22 is a schematic diagram describing an example of forming a T-shaped electrode in an element having a gate recess structure, which is an example (No. 2) of the step of forming an electrode in the method of manufacturing a fine T-shaped electrode according to the present invention.
Figure 23A:
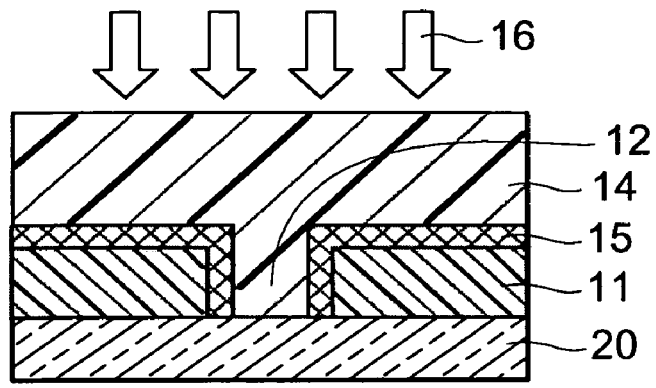
FIGS. 23A, 23B, 23C and 23D are schematic diagrams describing an example of the method of manufacturing a T-shaped electrode in the related art.
Figure 23B:
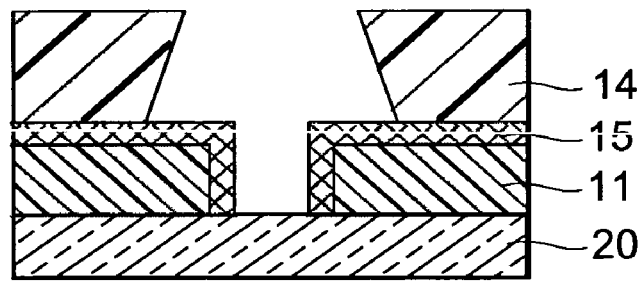
Figure 23C:
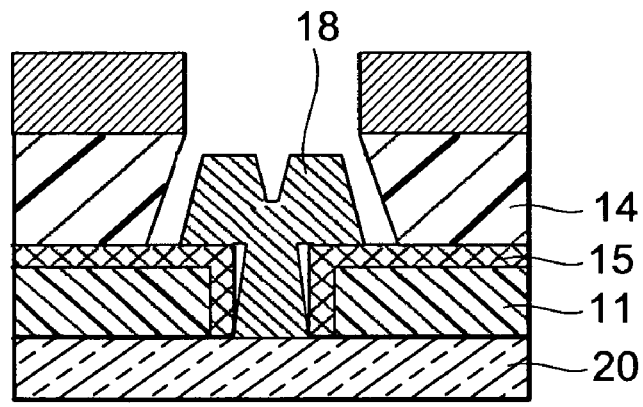
Figure 23D:
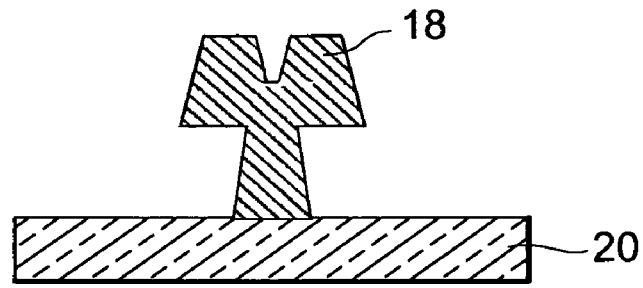
Figure 24A:
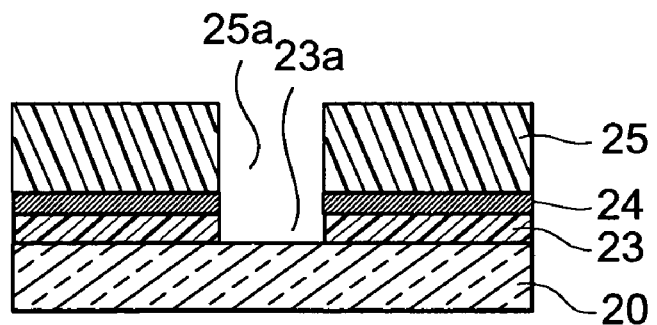
FIGS. 24A, 24B, 24C and 24D are schematic diagrams describing another example of the method of manufacturing a T-shaped electrode in the related art.
Figure 24B:
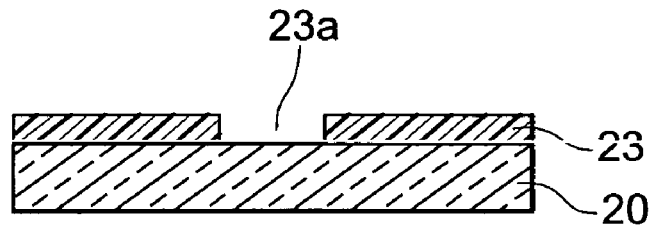
Figure 24C:
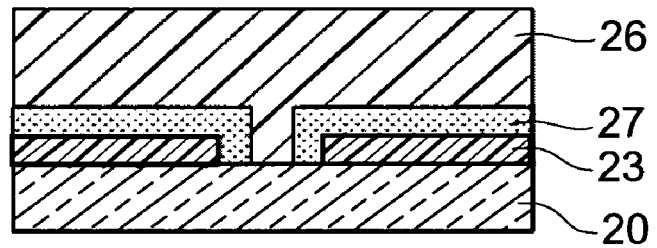
Figure 24D:
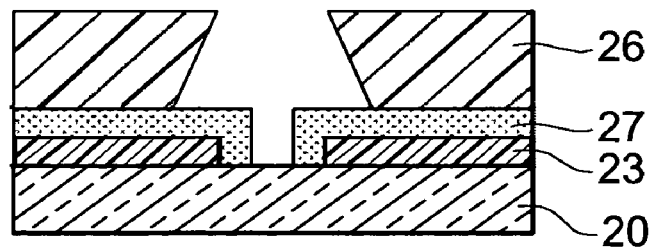

Next, in the same way as in the step of forming an electrode of Example 1, as shown in FIG. 21, the fine T-shaped electrode 10 having a gate length of about 0.1 μm was formed in the gate recess. By an identical processing to that of the lift-off in Example 1, the fine T-shaped electrode 10 shown in FIG. 22 was then formed.

According to the present invention, the problems in conventional technologies can be solved, and a method of manufacturing a fine T-shaped electrode at low cost and with high throughput, can be provided without using expensive processes such as electron beam patterning or SOR light exposure.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a T-shaped electrode, comprising:
   forming a laminated resist which comprises at least: a photoresist first layer as an uppermost layer, a second layer as a lowermost layer, and a third layer as a layer immediately above the second layer;
   forming an uppermost layer opening by irradiating the laminated resist with light to pattern only the photoresist first layer and form the uppermost layer opening;
   reducing the diameter of the uppermost layer opening formed in the photoresist first layer by coating a resist pattern thickening material on the photoresist first layer;
   forming a lowermost layer opening in the second layer of the laminated resist by transferring the uppermost layer opening formed in the photoresist first layer to the third layer and the second layer below the photoresist first layer, penetrating the laminated resist to form a lower electrode opening in the second layer and the third layer;
   after forming the lowermost layer opening, heating the laminated resist to make the lowermost layer opening into a taper structure;
   side-etching the third layer immediately above the second layer;
   after side-etching the third layer immediately above the second layer, reducing the size of the lowermost opening which is the taper structure in the lowermost layer of the laminated resist; and
   forming a T-shaped electrode in the lower electrode opening formed through the laminated resist.

2. A method of manufacturing a T-shaped electrode according to claim 1, wherein reducing the size of the lowermost layer opening is performed by coating the resist pattern thickening material on an exposed surface of the lowermost layer opening to thereby reduce the diameter of the lowermost layer opening formed in the lowermost layer.

3. A method of manufacturing a T-shaped electrode according to claim 1, wherein reducing the lowermost layer opening is performed by heating the lowermost layer opening, and the lowermost layer comprises a polymethyl methacrylate resist.

4. A method of manufacturing a T-shaped electrode according to claim 1, wherein forming the lower electrode opening is performed by etching treatment.

5. A method of manufacturing a T-shaped electrode according to claim 4, wherein the etching treatment is dry etching.

6. A method of manufacturing a T-shaped electrode according to claim 4, wherein the etching treatment comprises oxygen plasma ashing.

7. A method of manufacturing a T-shaped electrode according to claim 1, wherein the laminated resist comprises an insulating layer directly underneath the photoresist first layer.

8. A method of manufacturing a T-shaped electrode according to claim 7, wherein the insulating layer is deposited by plasma CVD.

9. A method of manufacturing a T-shaped electrode according to claim 1, wherein the second layer comprises a material which is capable of being thickened by the resist pattern thickening material.

10. A method of manufacturing a T-shaped electrode according to claim 1, wherein the second layer comprises an electron beam resist.

11. A method of manufacturing a T-shaped electrode according to claim 1, wherein the second layer comprises a polymethyl methacrylate resist.

12. A method of manufacturing a T-shaped electrode according to claim 1, wherein the third layer immediately above the second layer comprises a photoresist.

13. A method of manufacturing a T-shaped electrode according to claim 1, wherein the third layer immediately above the second layer comprises a resist having polymethyl glutarimide as a main component thereof.

14. A method of manufacturing a T-shaped electrode according to claim 1, wherein the laminated resist further comprises a fourth layer as a layer immediately below the uppermost layer, and the layer immediately below the uppermost layer comprises an electron beam resist.

15. A method of manufacturing a T-shaped electrode according to claim 1, wherein the laminated resist further comprises a fourth layer as a layer immediately below the photoresist first layer, and a layer immediately below the photoresist first layer comprises a polystyrene polymer-containing resist.

16. A method of manufacturing a T-shaped electrode according to claim 1, wherein the laminated resist further comprises four layers a fourth layer as a layer immediately below the photoresist first layer, and
wherein the second layer comprises a polymethylmethacrylate resist, the layer immediately above the second layer comprises a resist having polymethyl glutarimide as a main component thereof, the layer immediately below the photoresist first layer comprises a polystyrene polymer-containing resist, and the photoresist first layer comprises an ultraviolet light-sensitive resist.

17. A method of manufacturing a T-shaped electrode according to claim 1, wherein forming a T-shaped electrode comprises forming the T-shaped electrode by vapor deposition and then removing the laminated resist.

18. A method of manufacturing a T-shaped electrode according to claim 17, wherein the laminated resist is removed by a lift-off method.

19. A method of manufacturing a T-shaped electrode according to claim 1, wherein the resist pattern thickening material comprises a resin, a crosslinking agent and a surfactant.

20. A method of manufacturing a T-shaped electrode according to claim 19, wherein the resist pattern thickening material is at least one of water-soluble and alkali-soluble.

21. A method of manufacturing a T-shaped electrode according to claim 19, wherein the surfactant is a non-ionic surfactant.

22. A method of manufacturing a T-shaped electrode according to claim 19, wherein the resin is at least one selected from the group consisting of polyvinyl alcohol, polyvinyl acetal and polyvinyl acetate.

23. A method of manufacturing a T-shaped electrode according to claim 19, wherein the crosslinking agent is at least one selected from the group consisting of a melamine derivative, a urea derivative and an uril derivative.

24. A method of manufacturing a T-shaped electrode according to claim 19, wherein the resist pattern thickening material comprises at least one selected from the group consisting of a water-soluble aromatic compound and a resin comprising an aromatic compound in a portion thereof.

25. A method of manufacturing a T-shaped electrode according to claim 24, wherein the water-soluble aromatic compound is one selected from the group consisting of a polyphenol, an aromatic carboxylic acid, a naphthene polyhydric alcohol, a benzophenone, a flavonoid, derivatives thereof and glycosides thereof, and the resin comprising an aromatic compound in a portion thereof is one selected from the group consisting of a polyvinyl aryl acetal resin, a polyvinyl aryl ether resin and a polyvinyl aryl ester resin.

26. A method of manufacturing a T-shaped electrode according to claim 19, wherein the resist pattern thickening material further comprises an organic solvent.

27. A method of manufacturing a T-shaped electrode according to claim 26, wherein the organic solvent is at least one selected from the group consisting of an alcohol solvent, a straight-chain ester solvent, a cyclic ester solvent, a ketone solvent, a straight-chain ether solvent and a cyclic ether solvent.

28. A method of manufacturing a T-shaped electrode according to claim 19, wherein a total content of components other than water in the resist pattern thickening material is 1% by mass to 80% by mass.

* * * * *